US010505342B2

(12) United States Patent
Takazane et al.

(10) Patent No.: US 10,505,342 B2
(45) Date of Patent: Dec. 10, 2019

(54) LASER DEVICE

(71) Applicant: FANUC CORPORATION, Yamanashi (JP)

(72) Inventors: Tetsuhisa Takazane, Yamanashi (JP); Yuji Nishikawa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/925,403

(22) Filed: Mar. 19, 2018

(65) Prior Publication Data
US 2018/0287337 A1 Oct. 4, 2018

(30) Foreign Application Priority Data

Apr. 3, 2017 (JP) .................................. 2017-073645

(51) Int. Cl.
*H01S 5/024* (2006.01)
*B23K 26/70* (2014.01)
*B01F 15/06* (2006.01)
*H01S 5/40* (2006.01)

(52) U.S. Cl.
CPC .......... *H01S 5/02423* (2013.01); *B01F 15/06* (2013.01); *B23K 26/703* (2015.10); *B01F 2015/061* (2013.01); *H01S 5/4025* (2013.01)

(58) Field of Classification Search
None
See application file for complete search history.

(56) References Cited

U.S. PATENT DOCUMENTS

| 8,141,620 B1* | 3/2012 | Zrodnikov | F25B 45/00 165/104.32 |
| 2013/0025831 A1 | 1/2013 | Attinger et al. | |
| 2017/0149205 A1* | 5/2017 | Yoshida | H01L 23/473 |

FOREIGN PATENT DOCUMENTS

| JP | H03-165082 | * | 6/1991 |
| JP | 2007-251085 | * | 9/2007 |
| JP | 2010-196562 A | | 9/2010 |
| JP | 2011-152513 A | | 8/2011 |
| JP | 2012-192438 A | | 10/2012 |
| JP | 2012-240099 A | | 12/2012 |

(Continued)

OTHER PUBLICATIONS

An Office Action mailed by the Japanese Patent Office dated Dec. 4, 2018, which corresponds to Japanese Patent Application No. 2017-073645 and is related to U.S. Appl. No. 15/925,403; with partial English translation.

*Primary Examiner* — Tod T Van Roy
(74) *Attorney, Agent, or Firm* — Studebaker & Brackett PC

(57) ABSTRACT

There is provided a laser device that is able to reduce management tasks by employing microbubble-containing water in which cooling water contains microbubbles. A semiconductor laser device includes a laser oscillation device that includes the one or more laser cavities and a housing that houses the one or more laser cavities; a cooling unit that is arranged outside the laser oscillation device, and can cool circulated cooling water that is used to cool the laser oscillation device; and a cooling water circulation passage that links the laser oscillation device and the cooling unit to allow the circulated cooling water to circulate therethrough, the circulated cooling water being microbubble-containing water that contains microbubbles having a peak diameter of 100 μm or less.

15 Claims, 6 Drawing Sheets

(56) References Cited

FOREIGN PATENT DOCUMENTS

| JP | 2017-005141 A | | 1/2017 |
|----|---|---|---|
| KR | 20120100679 A | * | 9/2012 |
| WO | WO-2009022582 A1 | * | 2/2009 |
| WO | 2016/009622 A1 | | 1/2016 |
| WO | 2016/063814 A1 | | 4/2016 |
| WO | WO-2018185822 A1 | * | 10/2018 |

* cited by examiner

LASER DEVICE

This application is based on and claims the benefit of priority from Japanese Patent Application No. 2017-073645, filed on 3 Apr. 2017, the content of which is incorporated herein by reference.

BACKGROUND OF THE INVENTION

Field of the Invention

The present invention relates to a laser device. More specifically, the present invention relates to a laser device that uses microbubble-containing water as cooling water.

Related Art

Conventionally, a laser device includes a heat generating portion, for example, a plurality of laser cavities. This heat generating portion is cooled by a cooling member that uses cooling water provided from an external cooling unit. The cooling water is both supplied from the cooling unit to the cooling member and discharged from the cooling member to the cooling unit, to thereby circulate between the cooling unit and the cooling member via a circulation passage that connects the cooling unit to the cooling member.

As an example, purified water or ion exchange water is used as the cooling water because electrical conductivity at or below a predetermined value is required in order to prevent the metal pipe that constitutes the circulation passage from corroding. In addition, an anticorrosive or an antibacterial agent is sometimes mixed into the cooling water in order to prevent corrosion and water quality from decreasing, but these agents cause the electrical conductivity to increase, which thereby causes the metal pipe and other components to corrode. Further, managing the water quality of the cooling water is a laborious task as it is difficult to strike a balance between preventing the metal pipe and other components from corroding and achieving efficient maintenance.

In recent years, the use of water that includes microbubbles, such as nanobubble water, has been considered in various fields. As a technology related to laser devices, there is disclosed, for example, a technology of impregnating a liquid with microbubbles when performing laser cutting by irradiating a work piece with a laser beam in the liquid (see, for example, Patent Document 1). There is also disclosed, for example, a technology of using microbubble water as a liquid when laser cutting a hollow three-dimensional structure with a laser beam that has been guided to a liquid jet stream emitted from a jet nozzle (see, for example, Patent Document 2).

Patent Document 1: Japanese Unexamined Patent Application, Publication No. 2012-240099
Patent Document 2: Japanese Unexamined Patent Application, Publication No. 2012-192438

SUMMARY OF THE INVENTION

However, although the technologies disclosed in Patent Document 1 and 2 employ water that contains microbubbles in a laser device, they do not solve problems relating to cooling water. As one exemplary problem relating to cooling water, there is the problem that managing water quality of the cooling water is difficult due to corrosion of the metal pipe or other component that constitutes the circulation passage for the cooling water, or algae growing in the cooling water. As a result, time and effort is required to perform the necessary management tasks, causing the operating rate of the laser device to decrease in some cases. In addition, when the cooling water is not sufficiently managed, the laser device may become out of order.

As another example of a problem relating to cooling water, there are cases in which the metal pipe constituting the circulation passage of the cooling water is made thicker to counteract corrosion, which adversely affects the cooling efficiency of the laser device. There are some cases in which, for example, the cooling efficiency decreases and thus the conversion from electricity to laser becomes less effective, which in turn adversely affects the laser output and life time of the laser cavity or the like.

It an object of the present invention to provide a laser device that is able to reduce management tasks by employing microbubble-containing water in which cooling water contains microbubbles. Another object of the present invention is to provide a laser device that has excellent laser cavity cooling performance.

(1) In order to achieve the above-mentioned object, the present invention provides a laser device (for example, a semiconductor laser device 1 to be described later), including: a laser oscillation device (for example, a laser oscillation device 2 to be described later) including one or a plurality of laser cavities (for example, a laser cavity 12 to be described later), and a housing (for example, a housing 5 to be described later) that houses the one or a plurality of laser cavities; a cooling unit (for example, a cooling unit 3 to be described later) arranged outside the laser oscillation device, that is able to cool circulated cooling water that is used to cool the laser oscillation device; and a cooling water circulation passage (for example, a cooling water circulation passage 50 to be described later) that links the laser oscillation device and the cooling unit to allow the circulated cooling water to circulate, in which the circulated cooling water is microbubble-containing water that comprises microbubbles having a peak diameter of 100 µm or less.

(2) In the laser device according to (1), the circulated cooling water may be microbubble-containing water that contains microbubbles having a peak diameter of 1 µm or less.

(3) In the laser device according to (1) or (2), the laser device may further include a microbubble generator (for example, a microbubble generator 100 to be described later) that is provided in the laser oscillation device and is configured to generate microbubbles to generate the microbubble-containing water; and a first bypass passage (for example, a first bypass passage 110) that is linked to the microbubble generator and the cooling water circulation passage, and can supply the circulated cooling water to the microbubble generator from the cooling water circulation passage, and supply the microbubble-containing water that contains the microbubbles generated by the microbubble generator to the cooling water circulation passage.

(4) In the laser device according to (1) or (2), the laser device may further include a microbubble generator (for example, a microbubble generator 200 to be described later) that is provided outside the laser oscillation device and is configured to generate microbubbles to generate the microbubble-containing water; and a second bypass passage (for example, a second bypass passage 210) that is linked to the microbubble generator and the cooling water circulation passage, and can supply the circulated cooling water to the microbubble generator from the cooling water circulation passage, and supply the microbubble-containing water that contains the microbubbles generated by the microbubble generator to the cooling water circulation passage.

(5) In the laser device according to (4), the laser device may further include a storage container (for example, a storage container 300 to be described later) that can store the microbubble-containing water generated by the microbubble generator; and a third bypass passage (for example, a third bypass passage 310 to be described later) that is linked to the microbubble generator and the storage container, as well as the storage container and the cooling water circulation passage, and can supply the microbubble-containing water generated by the microbubble generator to the storage container, and supply the microbubble-containing water stored in the storage container to the cooling water circulation passage.

(6) in the laser device according to any one of (3) to (5), the microbubble generator may generate microbubbles using gas supplied from outside, or gas included in the circulated cooling water.

(7) In the laser device according to (6), the laser device may further include a gas selecting mechanism (for example, a gas selecting mechanism 120 to be described later) that can supply the gas to the microbubble generator, can select a type of gas to be supplied, and can select one or more types of gas from at least activated gas, inert gas, and air, and the microbubble generator may generate microbubbles of the gas selected and supplied by the gas selecting mechanism.

(8) in the laser device according to (7), the gas selecting mechanism may include a mode setting unit (for example, a mode setting unit 127 to be described later) that can change an operation mode.

(9) in the laser device according to any one of (6) to (8), the gas supplied to the microbubble generator may be nitrogen, and the microbubble generator may generate nitrogen microbubbles.

(10) In the laser device according to any one of (6) to (8), the gas supplied to the microbubble generator may be oxygen, and the microbubble generator may generate oxygen microbubbles.

(11) In the laser device according to any one of (6) to (8), the gas supplied to the microbubble generator may be compressed air or air, and the microbubble generator may generate air microbubbles.

(12) In the laser device according to any one of (1) to (11), the laser device may further include a cooling plate (for example, a cooling plate 22 to be described later) that is linked to the cooling water circulation passage, and is cooled either directly or indirectly by the circulated cooling water, in which the one or more laser cavities are arranged so as to come into contact with the cooling plate.

According to the present invention, there can be provided a laser device that is able to reduce management tasks by employing microbubble-containing water in which cooling water contains microbubbles. Further, according to the present invention, there can be provided a laser device that has excellent laser cavity cooling performance.

BRIEF DESCRIPTION OF THE DRAWINGS

FIG. 5 is a block diagram for illustrating a configuration of a laser device according to a fifth embodiment of the present invention.

DETAILED DESCRIPTION OF THE INVENTION

Embodiments of the present invention are described below with reference to the drawings. In the descriptions of the second to sixth embodiments, configurations that are common to the first embodiment are denoted by like reference symbols, and a description thereof is omitted.

First Embodiment

Figure 1:
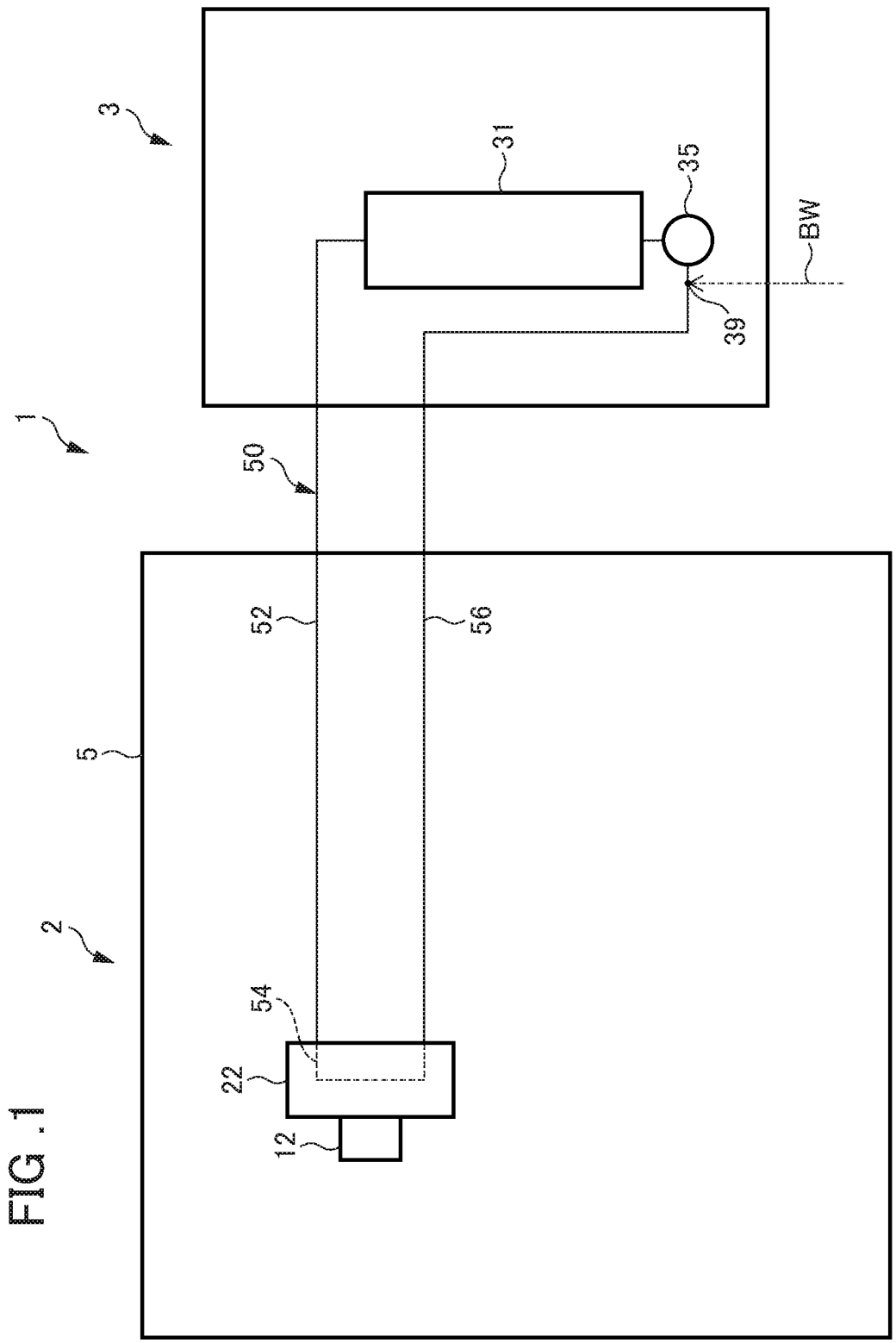
FIG. 1 is a block diagram for illustrating a configuration of a laser device according to a first embodiment of the present invention.

First, a semiconductor laser device 1 (laser device) is described with reference to FIG. 1. FIG. 1 is a block diagram for illustrating a configuration of a laser device according to a first embodiment of the present invention. As illustrated in FIG. 1, the semiconductor laser device 1 includes a laser oscillation device 2, a cooling unit 3, and a cooling water circulation passage 50. The semiconductor laser device 1 further includes a supply port 39 that can supply microbubble-containing water BW from the outside. The semiconductor laser device 1 according to this embodiment is a laser device that employs the microbubble-containing water BW supplied from the outside as circulated cooling water.

The laser oscillation device 2 is a laser oscillation device that is used for oscillating a laser beam that is to be output. The laser oscillation device 2 includes one or more laser cavities 12, and a housing 5 that houses the one or more laser cavities 12. The laser oscillation device 2 also includes various components (not shown) that are arranged inside the housing 5 to be housed by the housing 5. The laser oscillation device 2 is connected to the cooling unit 3, which is provided externally, via the cooling water circulation passage 50 to allow the microbubble-containing water BW to circulate as circulated cooling water.

The laser oscillation device 2 includes (in this embodiment one) laser cavity 12. The laser cavity 12 is a heat generating portion. The laser cavity 12 generates, for example, several tens of watts of heat energy in accordance with optical output energy. Therefore, the laser cavity 12 needs to be cooled to prevent functions from deteriorating due to temperature increase. In this embodiment, the laser cavity 12 is arranged (placed on) a cooling plate 22 to be described later so as to come into contact with the cooling plate 22.

The laser oscillation device 2 includes the cooling plate 22 that is used for cooling the laser cavity 12. The cooling plate 22 is a member that is placed on the laser cavity 12 and cools the laser cavity 12.

The cooling plate 22 is a cooling plate that is linked to the cooling water circulation passage 50, and is cooled either directly or indirectly by the microbubble-containing water BW as the circulated cooling water. The cooling plate 22 is, for example, configured of a plurality of stacked electrically heated plate members, and is configured to allow passage of the microbubble-containing water BW as the circulated cooling water between various layers. The cooling plate 22 includes a liquid passage 54 that allows passage of the microbubble-containing water BW as the circulated cooling water. The cooling plate 22 is cooled by the microbubble-containing water BW as the circulated cooling water, which is supplied from the cooling water circulation passage 50, passing through the liquid passage 54. Here, the cooling plate 22 has a higher cooling performance in terms of the laser cavity 12 as the electrically heated plate members that configure the cooling plate 22 are thinner.

The cooling unit 3 is a unit that is placed outside the laser oscillation device 2, and is able to cool the circulated cooling water that is used to cool the laser oscillation device 2. The cooling unit 3 is a unit that is placed outside the laser oscillation device 2, and is able to cool the circulated cooling water (microbubble-containing water BW) that is used to cool the laser cavity 12.

In this embodiment, the cooling unit 3 includes a cooling portion 31, a pump 35, and the supply port 39. The cooling portion. 31 is, for example, a heat exchanger through which low-temperature refrigerant passes. The cooling portion 31 cools the circulated cooling water (microbubble-containing water) by passing the circulated cooling water. The pump 35 sends the circulated cooling water from the cooling water circulation passage 50 (discharge passage 56 to be described later) to the cooling portion 31. The supply port 39 is a member that can supply the microbubble-containing water BW from outside to a circulation system as the circulated cooling water. In this embodiment, the semiconductor laser device 1 employs the microbubble-containing water BW that is generated outside of the semiconductor laser device 1. Therefore, the microbubble-containing water BW is supplied to the circulation system for the circulated cooling water from the supply port 39.

The cooling water circulation passage 50 links the laser oscillation device 2 and the cooling unit 3 in a manner that allows the circulated cooling water (microbubble-containing water BW) to circulate therethrough. The cooling water circulation passage 50 is configured to allow the circulated cooling water (microbubble-containing water BW) to circulate between the cooling unit 3 and the inside of the laser oscillation device 2. The cooling water circulation passage 50 is configured by including, for example, a metal pipe or a valve.

The cooling water circulation passage 50 includes a supply passage 52 and the discharge passage 56. The supply passage 52 is a passage that supplies the circulated cooling water (microbubble-containing water BW) from the cooling unit 3 (cooling portion 31) to the laser oscillation device 2. More specifically, the supply passage 52 is a passage that supplies the circulated cooling water (microbubble-containing water BW) from the cooling unit 3 (cooling portion 31) to the cooling plate 22.

The discharge passage 56 is a passage that returns the circulated cooling water (microbubble-containing water BW) to the cooling unit 3 (cooling portion 31) from the laser oscillation device 2. More specifically, the discharge passage 56 is a passage that returns the circulated cooling water (microbubble-containing water BW) to the cooling unit 3 (cooling portion 31) from the cooling plate 22. In this embodiment, the supply passage 39 is arranged above the discharge passage 56.

In this embodiment, the microbubble-containing water BW that is used as the circulated cooling water is microbubble-containing water that contains microbubbles having a peak diameter of 100 µm or less, preferably 10 µm or less, more preferably 1 µm or less. The microbubbles contained in the microbubble-containing water BW exist for a longer time as the diameter thereof becomes smaller.

In this embodiment, the type of gas used to form the microbubbles is not particularly limited. The type of gas used to form the microbubbles may be selected as appropriate based on required function or the like. The type of gas used to form the microbubbles can be selected from, for example, activated gas, inert gas, air, or the like. In this embodiment, the type of gas is mainly selected based on anti-corrosion and antibacterial properties.

The microbubble-containing water BW is generated by, for example, a rotating-flow microbubble generator, a pressurized dissolution-type microbubble generator, or a fine-pore microbubble generator. In addition, microbubble-containing water BW containing microbubbles with an even smaller diameter can be obtained by shrinking the microbubbles purified by the above-mentioned method under predetermined conditions, and subjecting any microbubbles that did not become finer to flotation separation.

The diameter of the microbubbles contained in the microbubble-containing water BW is, for example, measured by a known method, such as dynamic light scattering, or laser diffraction/scattering. The content of the microbubbles contained in the microbubble-containing water BW is not particularly limited, and is, for example, preferably 10,000,000 units/mL or more, more preferably 100,000,000 units/mL or more.

In this embodiment, the microbubble-containing water BW is supplied from the supply port 39, and used as the circulated cooling water. The microbubble-containing water BW exists for a certain amount of time in the cooling water circulation passage 50 in a state of containing microbubbles, but these microbubbles gradually disappear, and microbubble-containing water BW eventually becomes regular cooling water. The microbubble-containing water BW is used as is because the microbubble-containing water BW has a cooling function as regular cooling water even after the microbubbles have disappeared, and is exchanged with new microbubble-containing water BW after a certain period of time has elapsed.

According to this embodiment, the following effects can be achieved. In this embodiment, the semiconductor laser device 1 includes the laser oscillation device 2 that includes the one or more laser cavities 12 and the housing 5 that houses the laser cavity 12; the cooling unit 3 that is placed outside the laser oscillation device 2, and can cool the circulated cooling water that is used to cool the laser oscillation device 2; and the cooling water circulation passage 50 that links the laser oscillation device 2 and the cooling unit 3 to allow the circulated cooling water to circulate therethrough, the circulated cooling water being microbubble-containing water that contains microbubbles having a peak diameter of 100 µm or less. According to this embodiment, there can be provided a laser device that is able to reduce management, tasks by employing microbubble-containing water in which cooling water contains microbubbles. Further, according to this embodiment, the operating rate of the laser device can be improved because the time required for managing tasks relating to circulated cooling water is reduced.

In addition, according to this embodiment, microbubble-containing water that has an anti-corrosion function is used as the circulated cooling water, and hence the thickness of the metal pipe and the cooling plate that are used for the cooling water circulation passage can be made thinner. As a result, there can be provided a laser device that has excellent laser oscillation device (laser cavity) cooling performance. In addition, by increasing the cooling performance, conversion from electricity to laser becomes more effective, the output and quality of the laser increases, and the life time of the laser becomes longer.

In addition, in this embodiment, the circulated cooling water is microbubble-containing water that contains microbubbles having a peak diameter of 1 μm or less.

According to this embodiment, because microbubble-containing water with a microbubble peak diameter of 1 μm or less is employed, the microbubbles exist for a longer period of time. Therefore, the microbubbles have an anti-corrosion function for a long time. With this configuration, the frequency of exchanging the circulated cooling water in the laser device can be further reduced. In other words, there can be provided a laser device that is able to further reduce management tasks. Further, according to this embodiment, the operating rate of the laser device can be further improved because the time required for managing tasks relating to circulated cooling water is further reduced.

Second Embodiment

Figure 2:
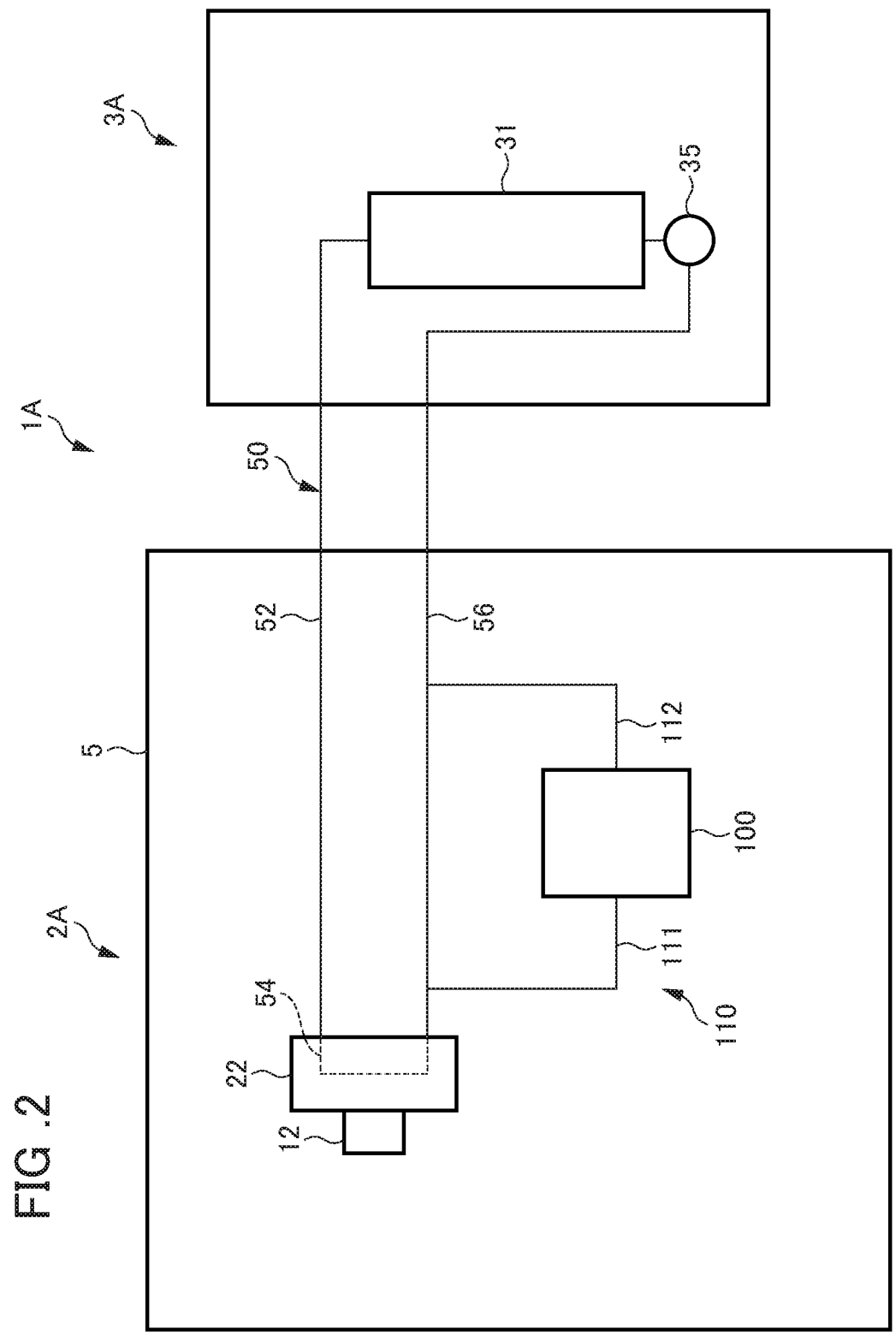
FIG. 2 is a block diagram for illustrating a configuration of a laser device according to a second embodiment of the present invention.

Next, with reference to FIG. 2, a laser device according to a second embodiment of the present invention is described. FIG. 2 is a block diagram for illustrating a configuration of the laser device according to the second embodiment. Herein, configurations different from those in the first embodiment are described, and a description of configurations that are the same as those in the first embodiment is omitted.

As illustrated in FIG. 2, a semiconductor laser device 1A includes a microbubble generator 100 on the laser oscillation device 2A side. The microbubble generator 100 is integrated into the laser oscillation device 2A. The semiconductor laser device 1A further includes the microbubble generator 100 and a first bypass passage 110.

The microbubble generator 100 is arranged in the laser oscillation device 2A. The microbubble generator 100 generates microbubbles to generate the microbubble-containing water. The microbubble generator 100 generates microbubbles according to the above-mentioned methods.

The microbubble generator 100 generates microbubbles using gas supplied from outside, or gas included in the circulated cooling water. The microbubble generator 100 is configured to receive a particular type of gas. In addition, when the microbubble generator 100 generates microbubbles using the gas included in the circulated cooling water, the gas from outside does not need to be supplied. For example, the microbubble generator 100 generates microbubbles using the air included in the circulated cooling water. In this case, because manly nitrogen and oxygen exist in a dissolved state, microbubble-containing water that has both the function of microbubble-containing water that contains nitrogen microbubbles and the function of microbubble-containing water that contains oxygen microbubbles is generated.

The microbubble generator 100 generates microbubbles within the circulated cooling water that is supplied by the first bypass passage 110 (a first supply passage 111 to be described later), and returns microbubble-containing water to the cooling water circulation passage 50 via the first bypass passage 110 (a first discharge passage 112 to be described later). The microbubble generator 100 operates both continuously and intermittently. Realistically speaking, the microbubble generator 100 is managed in terms of anti-corrosion and antibacterial properties, and is periodically operated at predetermined periods.

The first bypass passage 110 is linked to the microbubble generator 100 and the cooling water circulation passage 50, and is configured to be able to supply the circulated cooling water to the microbubble generator 100 from the cooling water circulation passage 50, and supply the microbubble-containing water BW that contains the microbubbles generated by the microbubble generator 100 to the cooling water circulation passage 50.

The first bypass passage 110 includes the first supply passage 111 and the first discharge passage 112. The first supply passage 111 is linked to the discharge passage 56 in the cooling water circulation passage 50 and the microbubble generator 100, and is configured to supply the circulated cooling water to the microbubble generator 100. The first discharge passage 112 is linked to the microbubble generator 100 and the discharge passage 56 in the cooling water circulation passage 50, and is configured to supply the microbubble-containing water BW generated by the microbubble generator 100 to the discharge passage 56 in the cooling water circulation passage 50.

According to this embodiment, the following effects can be achieved. In this embodiment, the semiconductor laser device 1A further includes the microbubble generator 100 that is provided in the laser oscillation device 2A and is configured to generate microbubbles to generate the microbubble-containing water; and the first bypass passage 110 that is linked to the microbubble generator 100 and the cooling water circulation passage 50, and can supply the circulated cooling water to the microbubble generator 100 from the cooling water circulation passage 50, and supply the microbubble-containing water that is generated by the microbubble generator 100 and contains the microbubbles to the cooling water circulation passage 50. According to this embodiment, because the microbubble generator 100 is integrated into the laser oscillation device 2A, the circulated cooling water can always be converted to the microbubble-containing water. With this configuration, the frequency of exchanging the circulated cooling water can be further reduced because the anti-corrosion and antibacterial effects continue.

In addition, according to this embodiment, because the microbubble generator 100 is integrated into the laser oscillation device 2A, space saving can be achieved. In addition, according to this embodiment, the microbubble generator 100 generates microbubbles using gas supplied from outside, or the gas included in the circulated cooling water.

According to this embodiment, when microbubbles are generated using the gas supplied from outside, the gas can be chosen based on the gas type that corresponds to the required function. With this configuration, microbubble-containing water that achieves the necessary functions can be generated just by selecting the type of gas to be used. Further, when microbubbles are generated using the gas included in the circulated cooling water, the microbubble generator 100 can be simplified. In addition, the burden of tasks and management is reduced.

Third Embodiment

Figure 3:
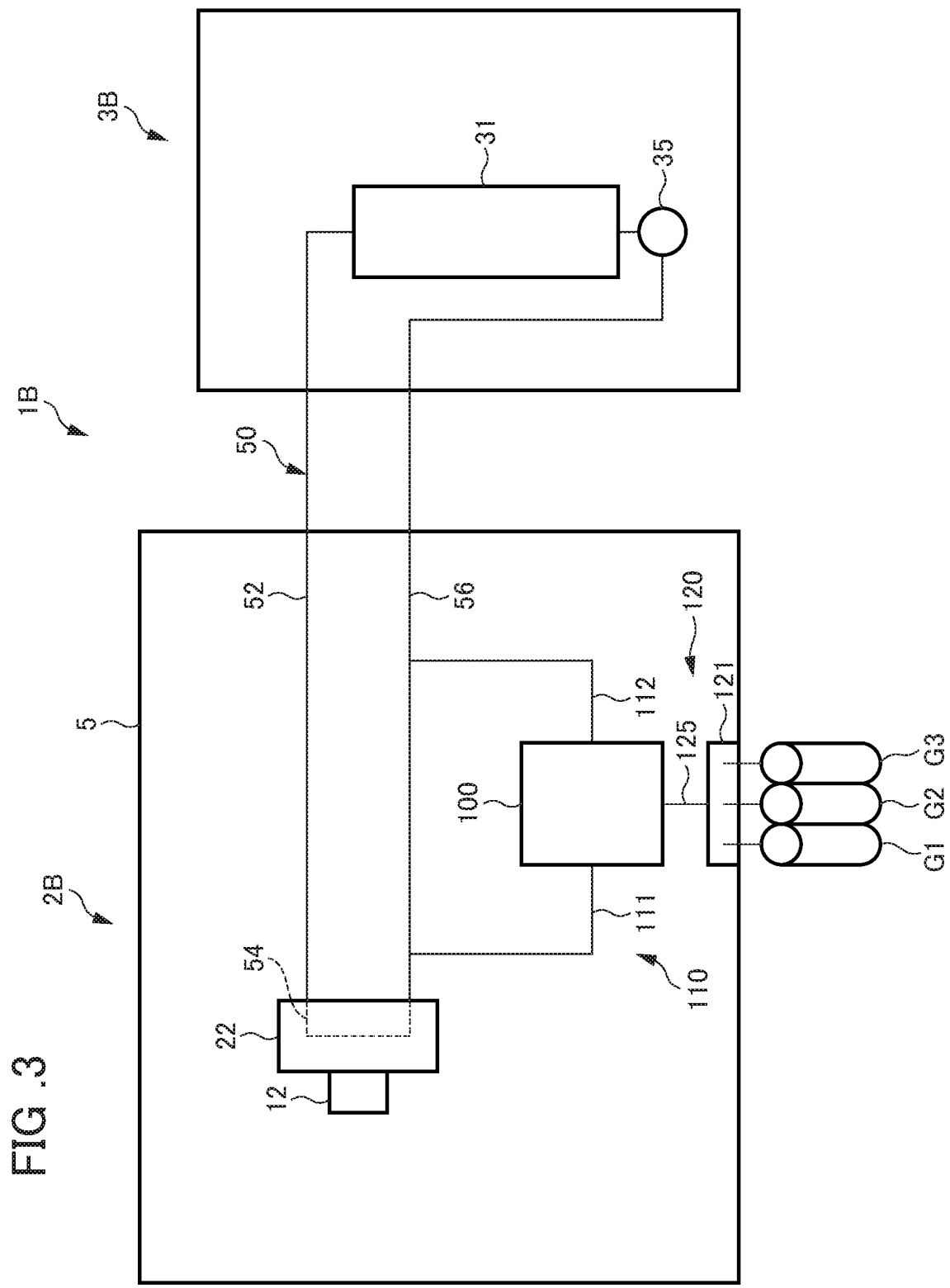

Next, with reference to FIG. 3, a laser device according to a third embodiment of the present invention is described. FIG. 3 is a block diagram for illustrating a configuration of the laser device according to the third embodiment. Herein, configurations different from those in the above-mentioned embodiments are described, and a description of like configurations is omitted.

As illustrated in FIG. 3, a semiconductor laser device 1B can supply gas to the microbubble generator 100, and includes a gas selecting mechanism 120 that can select the type of gas to be supplied. The semiconductor laser device 1B is a semiconductor laser device that is the semiconductor laser device 1A according to the second embodiment further provided with the gas selecting mechanism 120. The semiconductor laser device 1B further includes the gas selecting mechanism 120.

The gas selecting mechanism 120 includes a gas selecting unit 121 and a gas supply passage 125. The gas selecting unit 121 is configured to allow selection of the type of gas to be supplied to the microbubble generator 100. At least a gas cylinder, for example, that can supply an inert gas G1, an activated gas G2, or an air G3 is connected to the gas selecting unit 121. The gas selecting portion 121 is configured to be able to supply a specific type of gas to the microbubble generator 100 via a switching portion (not shown). The type of gas is selected based on required function of the circulated cooling water. In addition, the gas selecting portion 121 is configured to allow selection of a plurality of types of gas, and supply that gas to the microbubble generator 100.

The gas supply passage 125 is configured to supply the type of gas selected by the gas selecting portion 121 to the microbubble generator 100.

Here, the gas supplied to the microbubble generator 100 as the inert gas G1 is, for example, nitrogen. In this case, the microbubble generator 100 generates nitrogen microbubbles. The microbubble-containing water BW that contains the nitrogen microbubbles has a function of suppressing, for example, oxidization reactions in the metal pipe and the cooling plate 22 that constitute the cooling water circulation passage 50.

The gas supplied to the microbubble generator 100 as the activated gas G2 is, for example, oxygen. In this case, the microbubble generator 100 generates oxygen microbubbles. The microbubble-containing water BW that contains the oxygen microbubbles has a function of decomposing organic matter and preventing propagation of organisms in the circulated cooling water.

The gas supplied to the microbubble generator 100 as the air G3 is, for example, compressed air or outside air (air). When outside air is used, air that is incorporated via a filter (not shown) is to be used. In these cases, the microbubble generator 100 generates air microbubbles. The microbubble-containing water BW that contains the air microbubbles has the functions of the microbubble-containing water that contains nitrogen and oxygen.

According to this embodiment, the following effects can be achieved. In this embodiment, the semiconductor laser device 1B includes the gas selecting mechanism. 120 that can supply gas to the microbubble generator 100, and can select the type of gas to be supplied, in which one or more types of gas can be selected from at least activated gas, inert gas, and air, and the microbubble generator 100 generates microbubbles using gas that is selected and supplied by the gas selecting mechanism 120. According to this embodiment, the gas selecting mechanism 120 can select gas that corresponds to the required function, and supply that gas to the microbubble generator 100. Therefore, with the semiconductor laser device 1B, it is possible to obtain the microbubble-containing water that has the necessary function. In addition, according to this embodiment, because the gas selecting mechanism 120 can supply a plurality of types of gas to the microbubble generator 100, the microbubble-containing water having multiple functions can be obtained with the semiconductor laser device 1B.

In this embodiment, the gas supplied to the microbubble generator 100 is nitrogen, and hence the microbubble generator 100 generates nitrogen microbubbles. According to this embodiment, the microbubble generator 100 generates nitrogen microbubbles. Because the microbubble-containing water that contains the nitrogen microbubbles has a function of suppressing metal from oxidizing, this microbubble-containing water is favorably used to suppress oxidization reactions in the metal pipe and the cooling plate that constitute the cooling water circulation passage 50.

In this embodiment, the gas supplied to the microbubble generator 100 is oxygen, and hence the microbubble generator 100 generates oxygen microbubbles. According to this embodiment, the microbubble generator 100 generates oxygen microbubbles. Because the microbubble-containing water that contains the oxygen microbubbles has an antibacterial function, this microbubble-containing water is favorably used to prevent the decomposition of organic matter and propagation of organisms in the circulated cooling water.

In this embodiment, the gas supplied to the microbubble generator 100 is compressed air or air (outside air), and hence the microbubble generator 100 generates air microbubbles. According to this embodiment, the microbubble generator 100 generates air microbubbles. Because the microbubble-containing water BW that contains the air microbubbles has the functions of the microbubble-containing water that contains nitrogen and oxygen, this microbubble-containing water is favorably used to suppress oxidization reactions in the metal pipe and the cooling plate that constitute the cooling water circulation passage 50, and prevent the decomposition of organic matter and propagation of organisms in the circulated cooling water. Outside air is also beneficial in terms of costs and management.

Fourth Embodiment

Figure 4:
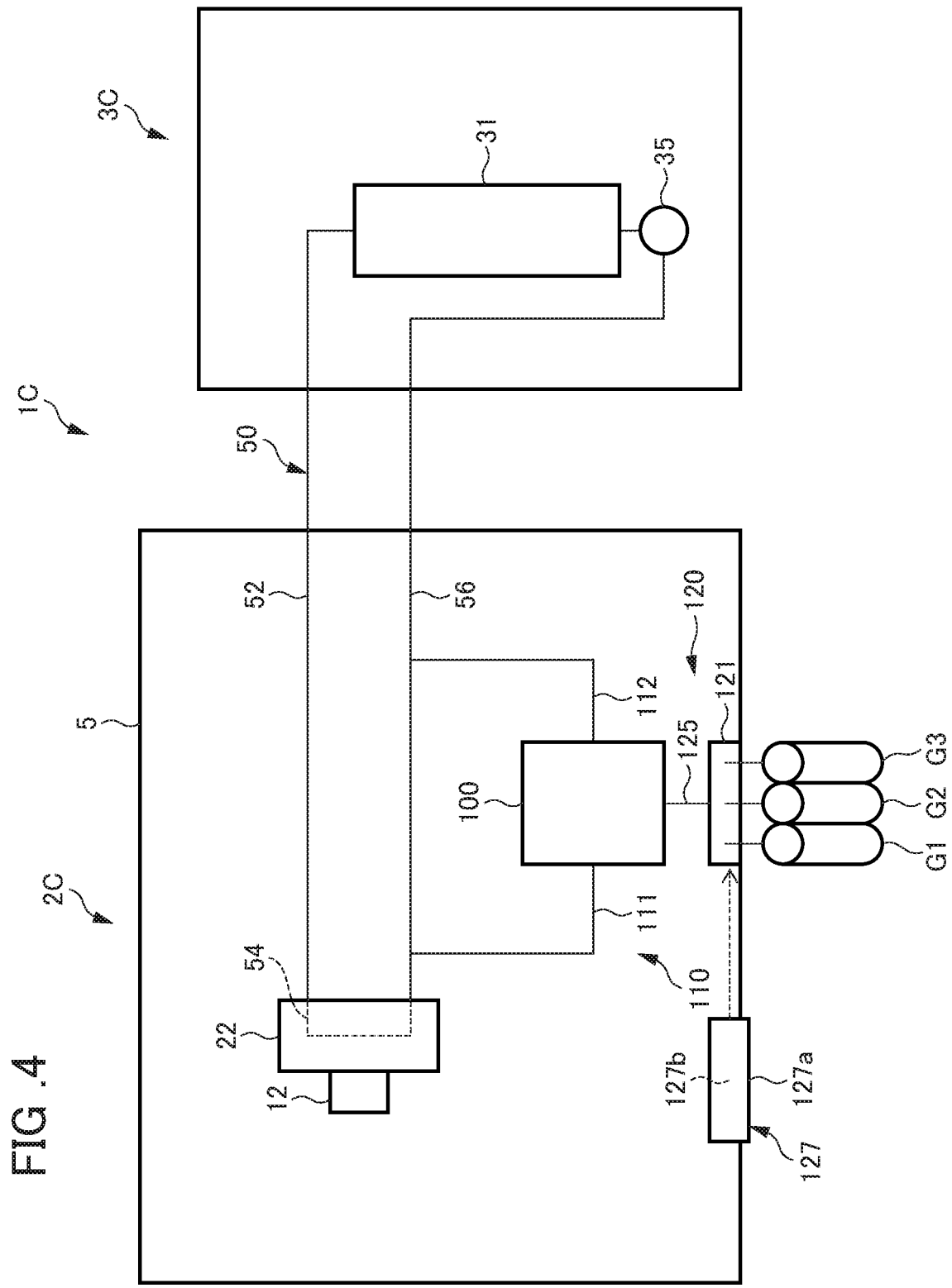
FIG. 4 is a block diagram for illustrating a configuration of a laser device according to a fourth embodiment of the present invention.

Next, with reference to FIG. 4, a laser device according to a fourth embodiment of the present invention is described. FIG. 4 is a block diagram for illustrating a configuration of the laser device according to the fourth embodiment. Herein, configurations different from those in the above-mentioned embodiments are described, and a description of like configurations is omitted.

As illustrated in FIG. 4, a semiconductor laser device 1C includes a mode setting unit 127 that can change an operation mode of the gas selecting mechanism 120. The semiconductor laser device 1C is a semiconductor laser device that is the semiconductor laser device 1B according to the third embodiment provided with the mode setting unit 127. The semiconductor laser device 1C further includes the mode setting unit 127.

The mode setting unit 127 includes a mode input unit 127a and a control unit 127b. The mode setting unit 127 is configured to enable the operate mode to be changed.

The mode input unit 127a can select the operation mode of the gas selecting mechanism 120, and is configured to enable a result of selection to be output to the control unit 127b. The mode input unit 127a is configured of, for example, a touch panel and buttons.

The control unit 127b outputs an instruction based on a given mode to a gas selecting mechanism 121 on the basis of information on the selection result output from the mode input unit 127a. The control unit 127b outputs an appropriate instruction for the selected operation mode to the gas selecting mechanism 121. Similarly, the control unit 127b also outputs an appropriate instruction to the microbubble generator 100.

As examples of the operation modes, there is given a mode for supplying nitrogen, which has a high anti-corrosive effect, to the gas selecting unit 121, and a mode for supplying oxygen, which has a high antibacterial effect, to the gas selecting unit 121. In addition, for example, there is given an automatic operation mode for automatically instructing selection and supply of the type of gas to the gas selecting unit 121 on the basis of operating time.

According to this embodiment, the following effects can be achieved. In this embodiment, the semiconductor laser device 1C includes the mode setting unit 127 that can change the operation mode. According to this embodiment, it is possible to easily perform management suited to a particular device or environment.

Fifth Embodiment

Figure 5:
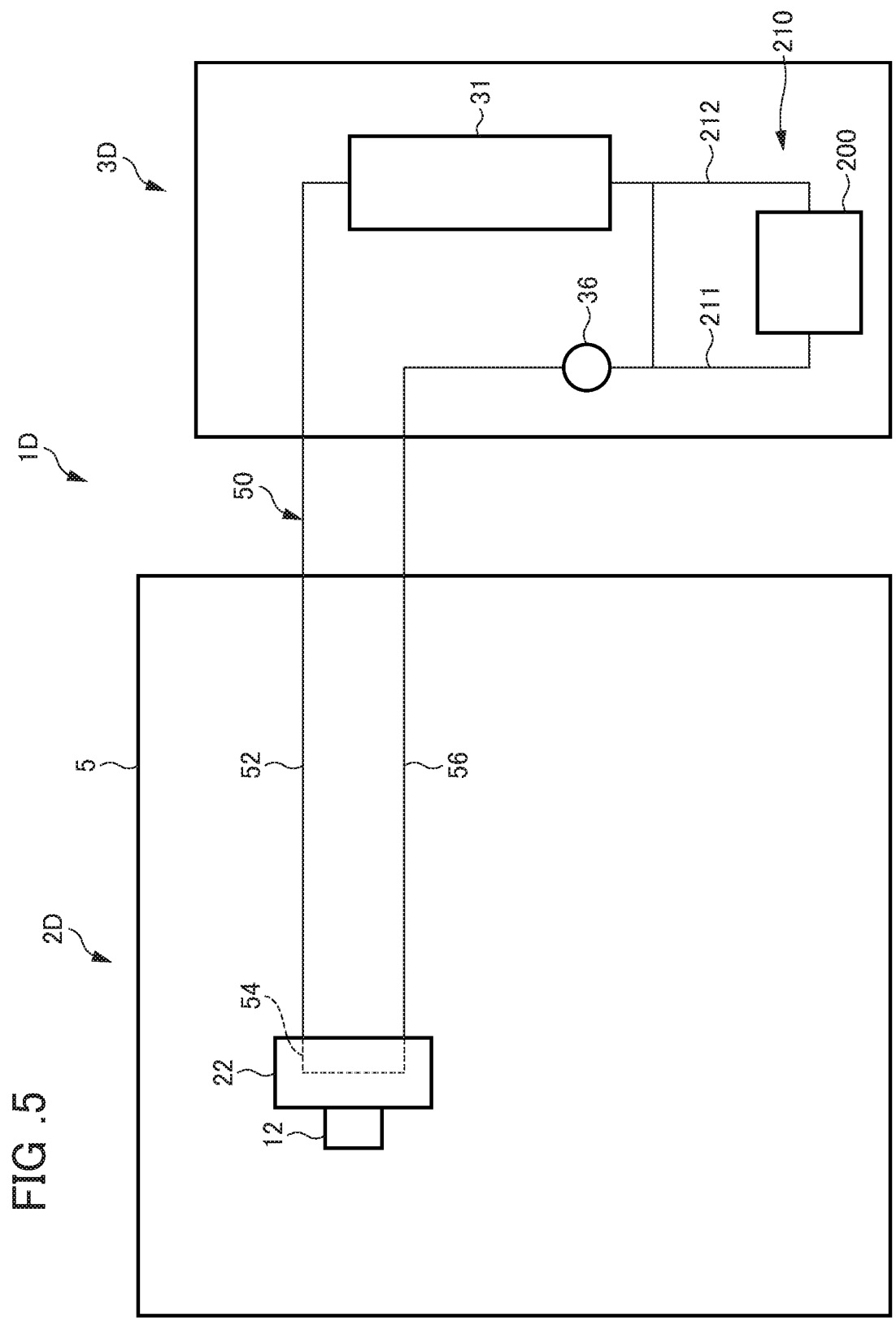
FIG. 5 is a block diagram for illustrating a configuration of a laser device according to a third embodiment of the present invention.

Next, with reference to FIG. 5, a laser device according to a fifth embodiment of the present invention is described. FIG. 5 is a block diagram for illustrating a configuration of the laser device according to the fifth embodiment. Herein, configurations different from those in the above-mentioned embodiments are described, and a description of like configurations is omitted.

As illustrated in FIG. 5, a semiconductor user device 1D includes a microbubble generator 200 on a cooling unit 3D side. The microbubble generator 200 is integrated into the laser oscillation device 2A. The semiconductor laser device 1D further includes the microbubble generator 200 disposed in the cooling unit 3D, and a second bypass passage 210.

In this embodiment, the microbubble generator 200 is disposed in the cooling unit 3D. The microbubble generator 200 generates microbubbles to generate the microbubble-containing water. The microbubble generator 100 generates microbubbles according to the above-mentioned methods.

The microbubble generator 200 generates microbubbles within the circulated cooling water that is supplied by the second bypass passage 210 (a second supply passage 211 to be described later), and returns microbubble-containing water to the cooling water circulation passage 50 via the second bypass passage 210 (a second discharge passage 212 to be described later). The microbubble generator 200 operates both continuously and intermittently. Realistically speaking, the microbubble generator 200 is managed in terms of anti-corrosion and antibacterial properties, and is periodically operated at predetermined periods.

The second bypass passage 210 is linked to the microbubble generator 200 and the cooling water circulation passage 50, and is configured to be able to supply the circulated cooling water to the microbubble generator 200 from the cooling water circulation passage 50, and supply the microbubble-containing water BW that contains the microbubbles generated by the microbubble generator 200 to the cooling water circulation passage 50.

The second bypass passage 210 includes the second supply passage 211 and the second discharge passage 212. The second supply passage 211 is linked to the discharge passage 56 in the cooling water circulation passage 50 and the microbubble generator 200, and is configured to supply the circulated cooling water to the microbubble generator 200. The second discharge passage 212 is linked to the microbubble generator 200 and the discharge passage 56 in the cooling water circulation passage 50, and is configured to supply the microbubble-containing water BW generated by the microbubble generator 200 to the discharge passage 56 in the cooling water circulation passage 50.

According to this embodiment, the following effects can be achieved. In this embodiment, the semiconductor laser device 1D further includes the microbubble generator 200 that is provided outside the laser oscillation device 2D and is configured to generate microbubbles to generate the microbubble-containing water; and the second bypass passage 210 that is linked to the microbubble generator 200 and the cooling water circulation passage 50, and can supply the circulated cooling water to the microbubble generator 200 from the cooling water circulation passage 50, and supply the microbubble-containing water that contains the microbubbles generated by the microbubble generator 200 to the cooling water circulation passage 50. According to this embodiment, because the microbubble generator 200 is integrated into the cooling unit 3, the circulated cooling water can always be converted to the microbubble-containing water. With this configuration, the frequency of changing the circulated cooling water can be further reduced because the anti-corrosion and antibacterial effects continue.

In addition, according to this embodiment, because the microbubble generator 200 is integrated into the cooling unit 3, space saving can be achieved. According to this embodiment, because the microbubble generator 200 is integrated into the cooling unit 3, a laser oscillation device that does not include the microbubble generator 200 can be used. The present embodiment is particularly favorably used when a plurality of laser oscillation devices 1 are to be connected to one cooling unit.

Sixth Embodiment

Figure 6:
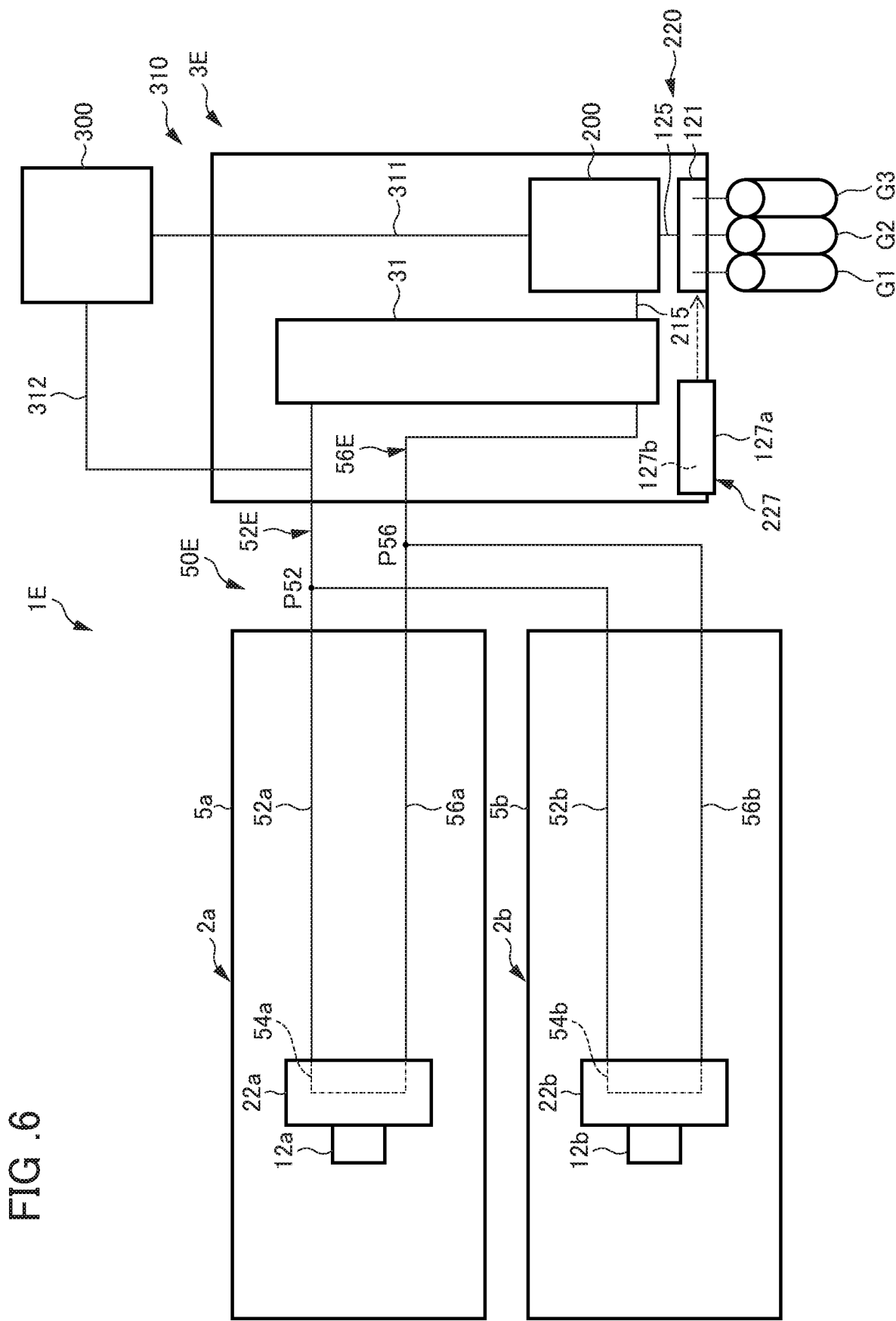
FIG. 6 is a block diagram for illustrating a configuration of a laser device according to a sixth embodiment of the present invention.

Next, with reference to FIG. 6, a laser device according to a sixth embodiment of the present invention is described. FIG. 6 is a block diagram for illustrating a configuration of the laser device according to the sixth embodiment. Herein, configurations different from those in the above-mentioned embodiments are described, and a description of like configurations is omitted.

As illustrated in FIG. 6, a semiconductor laser device 1E includes a plurality of (in this embodiment, two) laser oscillation devices. In addition, in the semiconductor laser device 1E, a gas selecting mechanism 220 is provided in a cooling unit 3E, and a storage container 300 that can store the microbubble-containing water is provided outside the cooling unit 3E.

The semiconductor laser device 1E includes a plurality of (in this embodiment, two) laser oscillation devices 2a and 2b, the gas selecting mechanism 220 provided in the cooling unit 3E, the storage container 300 provided outside the cooling unit 3E, and a third bypass passage 310.

The microbubble-containing water BW is supplied to the laser oscillation devices 2a and 2b from the cooling unit 3E or the storage container 300 via the cooling water circulation passage 50. The cooling water circulation passage 50 includes a supply passage 52E and a discharge passage 56E. The supply passage 52E includes a supply passage 32a and a supply passage 52b that are split by a branching point P52. The discharge passage 56E includes a discharge passage 56a and a discharge passage 56b that are split by a branching point P56.

The gas selecting mechanism 220 has the same configuration as that of the above-mentioned gas selecting mechanism 120. Likewise, the configuration of the mode setting unit 227, details of modes and the like are the same as those of the above-mentioned mode setting unit 127.

The storage container 300 is configured to allow storage of the microbubble-containing water BW generated by the microbubble generator 200. The microbubble-containing water BW generated by the microbubble generator 200 is supplied to and stored in the storage container 300 under a state in which the microbubble-containing water BW is not supplied to a cooling water circulation passage 50E. The microbubble-containing water BW stored in the storage container 300 is supplied to the cooling water circulation passage 50E as appropriate in accordance with the operation mode, for example. By providing the storage container 300, the microbubble generator 200 can be operated efficiently.

The third bypass passage 310 includes a supply passage 311 and a discharge passage 312. The third bypass passage 310 is linked to the microbubble generator 200 and the storage container 300, and the storage container 300 and the cooling water circulation passage 50E. The third bypass passage 310 can supply the microbubble-containing water BW generated by the microbubble generator 200 to the storage container 300, and can supply the microbubble-containing water BW stored in the storage container 300 to the cooling water circulation passage 50E. Cooling portion 31 is connected to microbubble generator 200 by way of passage 215.

According to this embodiment, the following effects can be achieved. In this embodiment, the semiconductor laser device 1E further includes the storage container 300 that can store the microbubble-containing water generated by the microbubble generator 200; and the third bypass passage (for example, the third bypass passage 310) that is linked to the microbubble generator 200 and the storage container 300, as well as the storage container 300 and the cooling water circulation passage 50E, and can supply the microbubble-containing water generated by the microbubble generator 200 to the storage container 300, and supply the microbubble-containing water stored in the storage container 300 to the cooling water circulation passage 50E. According to this embodiment, because the storage container 300 that stores the microbubble-containing water is provided, microbubble-containing water that is generated when there is no need to mix the microbubble-containing water into the circulated cooling water can be stored in the storage container 300. With this configuration, the microbubble generator 200 can be operated efficiently. In addition, with this configuration, a large amount of the stored microbubble-containing water can be supplied when needed in a short amount of time. In addition, with this configuration, the quality of the circulated cooling water can be maintained even if a plurality of laser oscillation devices are connected to one cooling unit. In addition, because a large amount of the stored microbubble-containing water can be supplied when needed in a short amount of time, manufacturing performance of the microbubble generator 200 can be reduced. Therefore, this contributes to the downsizing of devices.

The present invention has been described above in the first to sixth embodiments, but the present invention is not limited thereto. Any modifications or improvements within the scope that allows the object of the present invention to be achieved are included in the present invention.

EXPLANATION OF REFERENCE NUMERALS

1, 1A, 1B, 1C, 1D, 1E semiconductor laser device (laser device)

2, 2A, 2B, 2C, 2D, 2E laser oscillation device
3, 3A, 31B, 3C, 3D, 3E cooling unit
5 protective housing
12 laser cavity
22 cooling plate
50 cooling water circulation passage
100, 200 microbubble generator
110 first bypass passage
120, 220 gas selecting mechanism
127 mode setting unit
210 second bypass passage
300 storage container
310 third bypass passage

What is claimed is:

1. A laser device, comprising:
    a laser oscillation device comprising one or a plurality of laser cavities, and a housing that houses the one or a plurality of laser cavities;
    a cooling unit arranged outside the laser oscillation device, that is able to cool circulated cooling water that is used to cool the laser oscillation device;
    a cooling water circulation passage that links the laser oscillation device and the cooling unit to allow the circulated cooling water to circulate,
    a microbubble generator that is arranged in the laser oscillation device, and is configured to generate microbubbles to generate microbubble-containing water;
    a bypass passage that is linked to the microbubble generator and the cooling water circulation passage, the bypass passage being able to supply the circulated cooling water to the microbubble generator from the cooling water circulation passage, and supply the microbubble-containing water generated by the microbubble generator to the cooling water circulation passage, and
    a gas selecting mechanism that can supply gas to the microbubble generator, can select a type of gas to be supplied, and can select one or more types of gas from at least activated gas, inert gas, and air,
    wherein the microbubble generator generates microbubbles of the gas selected and supplied by the gas selecting mechanism,
    wherein the gas selecting mechanism comprises a mode setting unit that can automatically change an operation mode,
    wherein the operation mode that can be changed by the mode setting unit includes at least a mode for supplying inert gas and a mode for supplying activated gas,
    wherein the microbubbles of the micro-bubble containing water have a peak diameter of 100 μm or less.

2. The laser device according to claim 1, wherein the microbubbles of the microbubble-containing water have a peak diameter of 1 μm or less.

3. The laser device according to claim 1, wherein the inert gas supplied to the microbubble generator is nitrogen, and
    the microbubble generator generates nitrogen microbubbles.

4. The laser device according to claim 1, wherein the activated gas supplied to the microbubble generator is oxygen, and
    the microbubble generator generates oxygen microbubbles.

5. The laser device according to claim 1, further comprising a cooling plate that is linked to the cooling water circulation passage, and is cooled either directly or indirectly by the circulated cooling water, wherein the one or a plurality of laser cavities are arranged so as to come into contact with the cooling plate.

6. A laser device, comprising:
a laser oscillation device comprising one or a plurality of laser cavities, and a housing that houses the one or a plurality of laser cavities;
a cooling unit arranged outside the laser oscillation device, that is able to cool circulated cooling water that is used to cool the laser oscillation device;
a cooling water circulation passage that links the laser oscillation device and the cooling unit to allow the circulated cooling water to circulate;
a microbubble generator that is arranged outside the laser oscillation device, and is configured to generate microbubbles to generate the microbubble-containing water; and
a bypass passage that is linked to the microbubble generator and the cooling water circulation passage, the bypass passage being able to supply the circulated cooling water to the microbubble generator from the cooling water circulation passage, and supply the microbubble-containing water generated by the microbubble generator to the cooling water circulation passage; and
a gas selecting mechanism that can supply gas to the microbubble generator, can select a type of gas to be supplied, and can select one or more types of gas from at least activated gas, inert gas, and air,
wherein the microbubble generator generates microbubbles of the gas selected and supplied by the gas selecting mechanism,
wherein the gas selecting mechanism comprises a mode setting unit that can automatically change an operation mode,
wherein the operation mode that can be changed by the mode setting unit includes at least a mode for supplying inert gas and a mode for supplying activated gas,
wherein the microbubbles of the microbubble-containing water have a peak diameter of 100 µm or less.

7. The laser device according to claim 6, wherein the microbubbles of the microbubble-containing water have a peak diameter of 1 µm or less.

8. The laser device according to claim 6, wherein the inert gas supplied to the microbubble generator is nitrogen, and
the microbubble generator generates nitrogen microbubbles.

9. The laser device according to claim 6, wherein the activated gas supplied to the microbubble generator is oxygen, and
the microbubble generator generates oxygen microbubbles.

10. The laser device according to claim 6, further comprising a cooling plate that is linked to the cooling water circulation passage, and is cooled either directly or indirectly by the circulated cooling water,
wherein the one or a plurality of laser cavities are arranged so as to come into contact with the cooling plate.

11. A laser device, comprising:
a laser oscillation device comprising one or a plurality of laser cavities, and a housing that houses the one or a plurality of laser cavities;
a cooling unit arranged outside the laser oscillation device, that is able to cool circulated cooling water that is used to cool the laser oscillation device;
a cooling water circulation passage that links the laser oscillation device and the cooling unit to allow the circulated cooling water to circulate;
a microbubble generator that is arranged outside the laser oscillation device, and is configured to generate microbubbles to generate microbubble-containing water;
a storage container that can store the microbubble-containing water generated by the microbubble generator; and
a bypass passage that is linked to the microbubble generator and the storage container, as well as the storage container and the cooling water circulation passage, the bypass passage being able to supply the microbubble-containing water generated by the microbubble generator to the storage container, and supply the microbubble-containing water stored in the storage container to the cooling water circulation passage; and
a gas selecting mechanism that can supply gas to the microbubble generator, can select a type of gas to be supplied, and can select one or more types of gas from at least activated gas, inert gas, and air,
wherein the microbubble generator generates microbubbles of the gas selected and supplied by the gas selecting mechanism,
wherein the gas selecting mechanism comprises a mode setting unit that can automatically change an operation mode,
wherein the operation mode that can be changed by the mode setting unit includes at least a mode for supplying inert gas and a mode for supplying activated gas,
wherein the microbubbles of the microbubble-containing water have a peak diameter of 100 µm or less.

12. The laser device according to claim 11, wherein the microbubbles of the microbubble-containing water have a peak diameter of 1 µm or less.

13. The laser device according to claim 11, wherein the inert gas supplied to the microbubble generator is nitrogen, and
the microbubble generator generates nitrogen microbubbles.

14. The laser device according to claim 11, wherein the activated gas supplied to the microbubble generator is oxygen, and
the microbubble generator generates oxygen microbubbles.

15. The laser device according to claim 11, further comprising a cooling plate that is linked to the cooling water circulation passage, and is cooled either directly or indirectly by the circulated cooling water,
wherein the one or a plurality of laser cavities are arranged so as to come into contact with the cooling plate.

* * * * *